US006750659B2

(12) United States Patent
Murphy

(10) Patent No.: US 6,750,659 B2
(45) Date of Patent: Jun. 15, 2004

(54) INHERENTLY STABLE ELECTROSTATIC ACTUATOR TECHNIQUE WHICH ALLOWS FOR FULL GAP DEFLECTION OF THE ACTUATOR

(75) Inventor: Terence J. Murphy, Plano, TX (US)

(73) Assignee: Texas Intruments Incorporated, Dallas, TX (US)

( * ) Notice: Subject to any disclaimer, the term of this patent is extended or adjusted under 35 U.S.C. 154(b) by 27 days.

(21) Appl. No.: 10/170,311

(22) Filed: Jun. 13, 2002

(65) Prior Publication Data

US 2003/0006777 A1 Jan. 9, 2003

Related U.S. Application Data

(60) Provisional application No. 60/301,784, filed on Jun. 28, 2001.

(51) Int. Cl.[7] ................................................ G01R 27/26
(52) U.S. Cl. ........................................ 324/686; 324/457
(58) Field of Search ........................ 73/514.16; 324/457, 324/658, 686; 361/207, 277, 278, 288

(56) References Cited

U.S. PATENT DOCUMENTS 6,377,438 B1 * 4/2002 Deane et al. ............... 361/278
6,501,282 B1 * 12/2002 Dummermuth et al. ..... 324/679
6,512,381 B2 * 1/2003 Kramer ...................... 324/658
6,617,750 B2 * 9/2003 Dummermuth et al. ..... 310/309

* cited by examiner

*Primary Examiner*—N. Le
*Assistant Examiner*—Walter Benson
(74) *Attorney, Agent, or Firm*—W. Daniel Swayze, Jr.; W. James Brady; Frederick J. Telecky, Jr.

(57) ABSTRACT

A electrostatic sensing device for sensing a voltage from a electrostatic device, includes a first actuator having a first membrane and a first electrode, the first membrane being moveable and a second actuator having a second membrane and a second electrode, the second membrane being moveable. Additionally, a control device controls the first actuator and the second actuator to alternatively charge the first actuator with a first charge and the second actuator with a second charge, and a circuit outputs a first voltage linearly based on the first charge and a second voltage linearly based on the second charge.

6 Claims, 4 Drawing Sheets

INHERENTLY STABLE ELECTROSTATIC ACTUATOR TECHNIQUE WHICH ALLOWS FOR FULL GAP DEFLECTION OF THE ACTUATOR

This application claims priority under 35 USC §119(e)(1) of provisional application Serial No. 60/301,784, filed Jun. 28, 2001.

FIELD OF THE INVENTION

The present invention relates generally to the field of micro-electromechanical actuators and more particularly to an apparatus and method for eliminating the non-linearity associated with sensing the capacitance which is associated with the operation of micro-electromechanical actuators and for achieving balance when sensing so that no net effect results from the sensing.

BACKGROUND OF THE INVENTION

Developments in micro-electromechanical system (MEMS) have facilitated exiting advancements in the field of sensors, accelerometers, pressure sensors, micro-machines (microsized pumps and motors) and control components in high definition TV displays and spatial light modulators and other actuators.

Micro-mechanical actuators may have an active element in a thin metallic membrane movable through the application of a DC electrostatic field. The upper contact of the actuator includes a 0.3-millimeter aluminum or gold membrane suspended across polymer posts. Surface micromachining undercuts the post material from beneath the membrane, releasing it to be actuate. The suspended membrane typically resides, in one example 0.4-micrometers, above the substrate surface. On the substrate surface, a bottom contact includes an exemplary 0.7-micrometer gold or aluminum, first metal layer. On top of this the metal layer is positioned a thin dielectric layer, typically 1,000 Å of silicon nitride.

In the unactuated state, the membrane actuator exhibits a high impedance due to the air gap between the bottom and top plates. Application of a DC potential between the upper and lower metal plates causes the thin upper membrane to deflect downwards due to the electrostatic attraction between the plates. When the applied potential exceeds the pull-in voltage of the actuator, the membrane deflects into an actuated position. In this state, the top membrane rests directly on the dielectric layer and is capacitively coupled to the bottom plate. The capacitive coupling causes the actuator to exhibit a low impedance between the two switch contacts. The ratio of the on and off impedances of the switch is determined by the on and off capacitances of the switch in the two actuating states.

Another use for the actuator with an reflective surface is to tilt the actuator about an axis for use as a mirror. These mirrors can be used in optical devices. Additionally, the top plate includes a pivot point so that approximately half of the top membrane can pivot in one direction while the other half of the top membrane under the bottom plate can pivot in an opposite direction.

A problem with capacitance coupling devices is that capacitance varies as a non linear function with the respect to the distance between the parallel plates being sensed. Additionally, the net electrostatic force created by the sensing of the capacitive devices causes an offset and a gain error which in most cases is a highly undesired effect. In MEMS devices or any other electrostatic system or capacitance that is being sensed between the plates, the capacitance is a non-linear function of the distance between the plates. When sensing the change in capacitance, a non-linear result with respect to the positional information of the moveable plate is obtained. This often causes undesirable results or increased computation to remove the effect in these types of systems.

SUMMARY OF THE INVENTION

The present invention provides a sensing technique that electrostatically balances the device at a frequency that can be set higher than the mechanical frequency of the device that is being sensed and thus create a net zero movement in terms of sensing. By sensing the inverse of the capacitance of the actuator, the sensed voltage is an indication of the distance between the plates and the relationship between the sensed voltage and the capacitance is linear eliminating the undesired effect. Additionally, the present invention balances the sensing so that no effect due to the sensing itself is created. Thus it is possible to move a relatively small distance between the plates when the voltages are large.

DETAILED DESCRIPTION OF THE DRAWINGS

Figure 1:
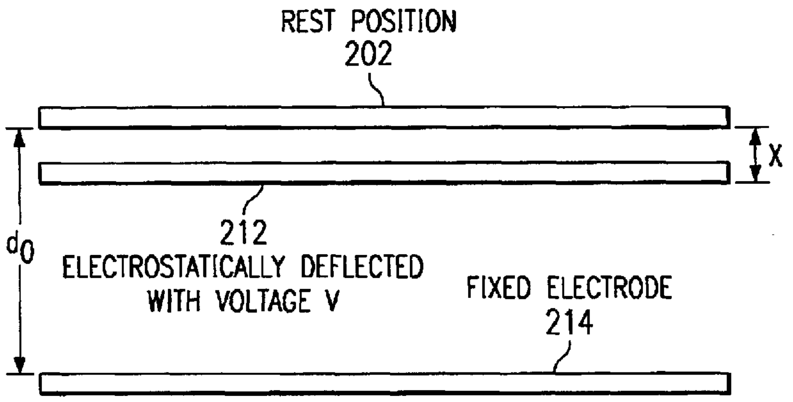
FIG. 1 illustrates a simplified view of the actuator of the present invention.

In FIG. 1, a simplified diagram of the electromechanical portion of the actuator is illustrated. The top membrane 202 is illustrated in a rest position and additionally the top membrane 202 is illustrated in a deflected position moved a distance X. The top membrane 202 maybe moved the entire distance between the rest position and a level position on the fixed electrode 214 with stability. A lumped element, one-dimensional model can be used to approximate the electromechanical motion of the actuator 200 of the present invention. This model approximates the electromechanical portion of the actuator 200 as a single, ridged, parallel plate, capacitor suspended above the fixed ground plate by a ideal linear spring. It has a single degree of freedom, which is the gap beneath the top movable membrane 202 and the bottom fixed electrodes 214.

Equation 1 is illustrated below. Equation 1 illustrates the electrostatic force between the top membrane 202 and the bottom fixed electrode 214. Additionally, Equation 1 shows the force of a spring and the electrostatic force.

$$F_{es} = \frac{\in AV^2}{2(d_0 - x)^2} \quad F_{spring} = kx$$

Equation 1 illustrates that $D_0$ is the distance between the top membrane 202 and the bottom or fixed electrode 214; is the actual distance between the top membrane 202 in a rest position and the top membrane 202 in a deflected position with voltage V; A is the area of the top membrane 202, V is the voltage applied, and ϵ equals the modulus.

Figure 2:
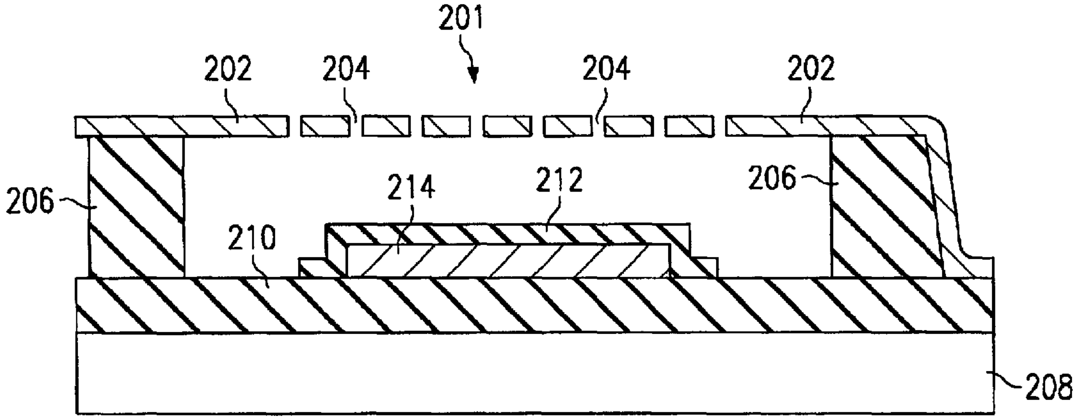
FIG. 2 illustrates a more detailed view of a portion of the actuator.

FIG. 2 illustrates an electromechanical portion 201 of the actuator. The electromechanical portion 201 includes a top membrane 202, which covers the insulating spacer 206 and the dielectric 212. The top membrane 202 includes holes 204 to provide flexibility to the top membrane 202 so that the top membrane 202 may be deflected to engage the dielectric 212. The insulating spacer 206 is illustrated on either side of dielectric 212; however, a three dimensional model could have the insulting spacer 206 completely surrounding the dielectric 212. The dielectric 212 prevents the membrane 202 from touching the electrode 214. On top of top membrane 202 is a coating of highly reflective metal such as gold to form a mirror surface.

Figure 3:
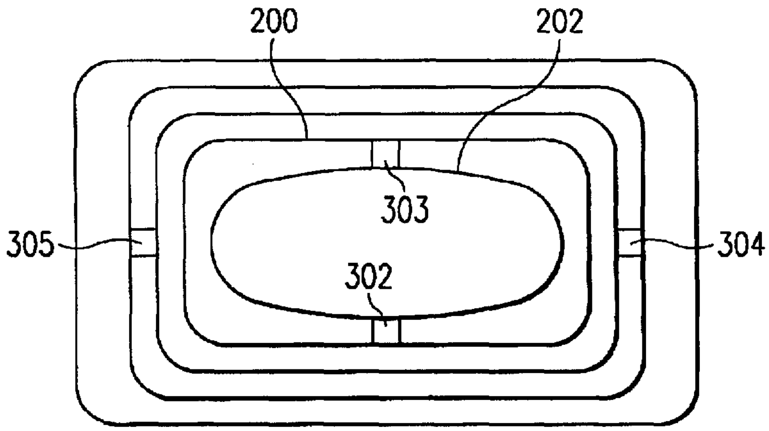
FIG. 3 illustrates an overview of the actuator of the present invention.

A top view of the actuator 200 is illustrated in FIG. 3. The top membrane 202, which is coated with a high reflective metal such as the gold as mentioned above, is pivoted among pivots 302 and 304 so that the top membrane 202 moves in a first direction, for example, up and down. Secondly, the top membrane 202 is connected to a second set of pivots 304 and 305 to move the top membrane 202 in substantially a direction, which is 90° to the first direction.

Figure 4:
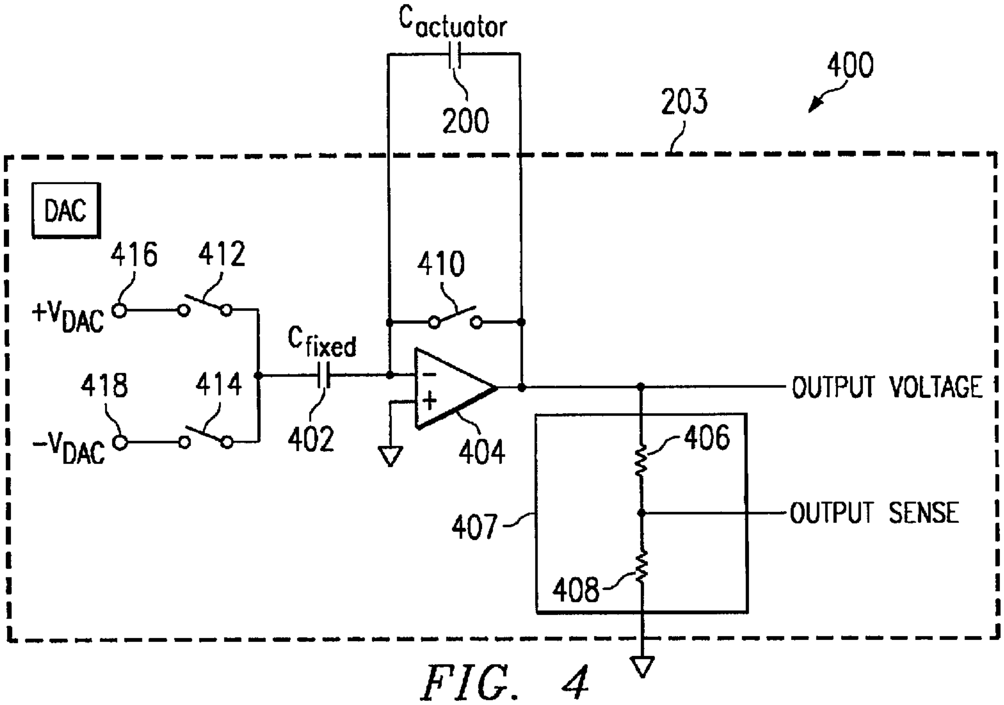
FIG. 4 illustrates a control circuit of the actuator of the present invention.

Turning now to FIG. 4, the electromechanical portion 201 of the actuator 200 is illustrated as $C_{actuator}$ in FIG. 4.

FIG. 4 illustrates a control device 203 of the present invention; the electromechanical portion 201 as shown a capacitor is connected to the negative input of the linear amplifier 404 and the other end of the capacitor or electromechanical portion 201 to the output linear amplifier 404. Additionally, the switch 410 is connected in parallel to the electromechanical portion 201 of the actuator. The switch 410 and the electromechanical portion 201 are connected to a voltage divider circuit 407, which consists of resistor 406 connected in series to resistor 408. The voltage divider circuit 407 reduces the output voltage to a voltage, which is more easily sensed, and provides the voltage output of the linear amplifier or the sensed output is an indication of the position of the electromechanical portion 200. A fixed capacitor 402 is connected additionally in series with the electromechanical portion 200 and to the negative input of linear amplifier 404. Additionally, the positive input of linear amplifier 404 is connected to a reference voltage or to ground. A first digital to analog converter (DAC) generates a voltage to input to terminal 416 and a second digital to analog terminal 418. Before the start of operation, the switch 410 is closed, shorting the electromechanical portion 201 so that it is inactivated. Next, either switch 412 or 414 are closed to induce a voltage on the fixed capacitor 402. The voltage input to terminal 416 indicates the amount of deflection X that is required for the mirror or more specifically the top membrane 202. After the capacitor 402 has been charged, as a result of the voltage being applied to terminal 416, as been applied to the fixed capacitor 402, the switch 410 opens and the charge on fixed capacitor 402 is transferred to the electromechanical portion 201, more specifically the top membrane 202 and the bottom electrode 214. The charge transfer to the electromechanical portion 200 causes a movement of the top membrane 202. Thus, the output voltage is determined by the following equations.

$$\text{Output} = \frac{C_{fixed} * 2 * V_{DAC}}{C_{actuator}} = \frac{C_{fixed} * 2 * V_{DAC} * (d_0 - x)}{\in A}$$

$$\text{Voltage Swing } F_{es} = \frac{\in A\left[\frac{C_{fixed} * 2 * V_{DAC}}{C_{actuator}}\right]^2}{2(d_0 - x)^2} = \frac{2(C_{fixed} * V_{DAC})^2}{\in A}$$

The force remains constant as indicated by the above formulas. The output voltage provides an indication of the displacement and this can be sensed through the voltage divider circuit 406 and 408 to provide a reduced voltage of the output voltage.

Figure 5:
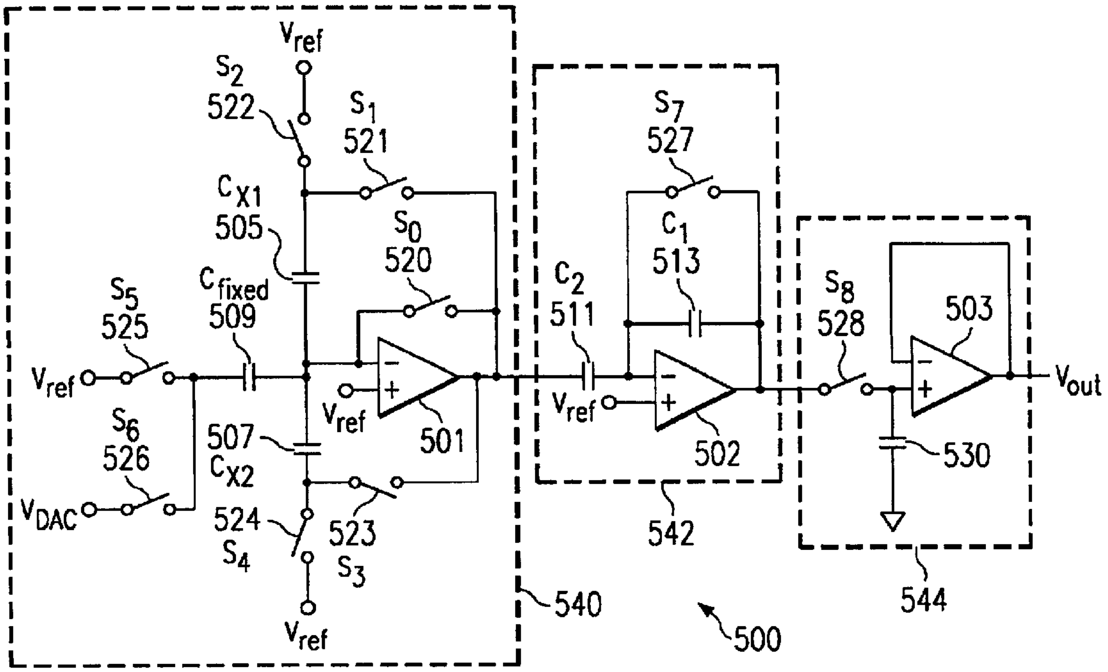
FIG. 5 illustrates the a second or another control circuit of the actuator of the present invention.
Figure 6A:
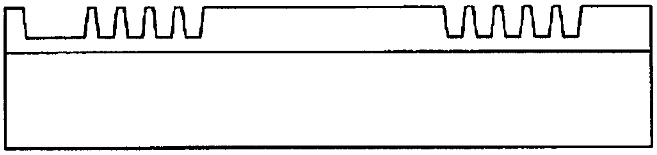
FIG. 6 illustrates a being diagram of switches of the second control circuit of the present invention.
Figure 6B:
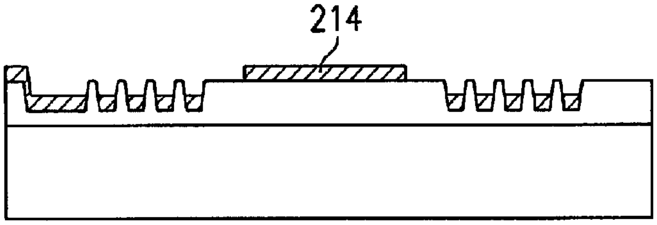
Figure 6C:
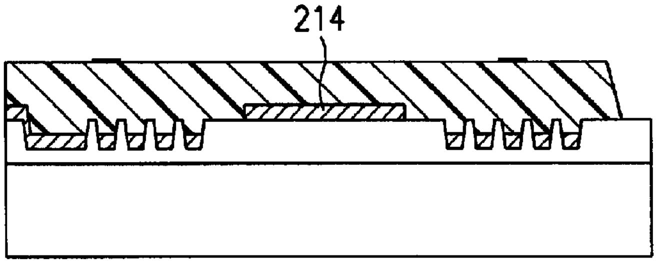
Figure 6D:
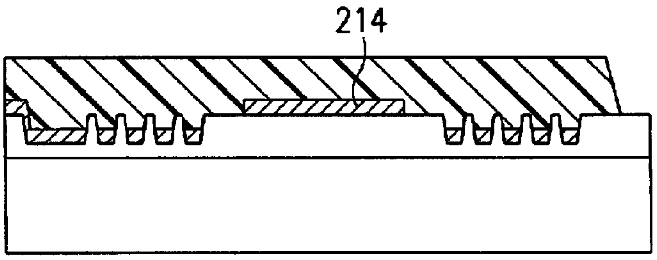
Figure 6E:
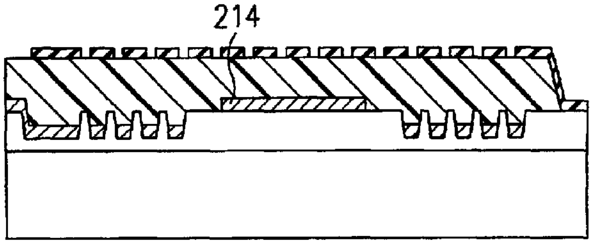
Figure 6F:
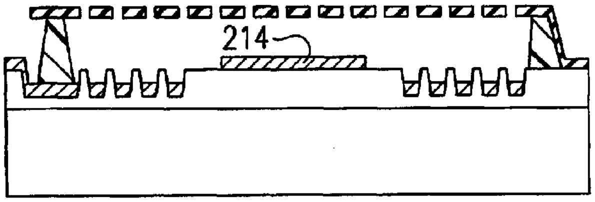

Turning now to FIG. 5, FIG. 5 illustrates second control system 500 of the present invention. FIG. 5 illustrates that the second control circuit includes three stages. The first stage is an electrostatically balanced sense stage 540; the second stage is a gain and differening stage 542; and a third stage is a sample and hold stage 544. The electrostatic balanced sense stage 540 includes two actuators, actuator 505 and actuator 507, these are similar in design to actuator 200. The actuator 505 and the actuator 507 are commonly connected at one end. Additionally, the commonly connected actuators 505 and 507 are connected to capacitor 509 and connected to switch 520 and the negative input of linear amplifier 501. The plus input of linear amplifier 501 is connected to a reference voltage such as $V_{REF}$ or even ground. The other end of capacitor 509 is connected to a pair of parallel switches including switch 525 and switch 526. Switch 525 is connected to ground or $V_{REF}$, and switch 526 is connected to $V_{DAC}$, which provides a variable voltage. The switch 520 between the negative input to the linear amplifier 501 and the output of the linear amplifier 501. Additionally, the other end of actuator 505 is connected to switch 521. The other end of switch 521 is connected to the output of the linear amplifier. Additionally, the other end of actuator 507 is connected to switch 523; the other end of switch 523 is connected to the output of linear amplifier 501. The switch 523 controls actuator 507. Likewise, switch 521 controls actuator 505. Additionally, switch 522 is connected to actuator 505 and connected to $V_{REF}$. Likewise, switch 524 is connected to the other end of actuator 507 and connected to $V_{REF}$. Switche 522 and switch 524 are used when actuator 505 and actuator 507 are inactive to remove the charge from actuator 505 and actuator 507 respectively. The switches 522 and 524 place the reference voltage, for example, ground voltage on actuator 505 and actuator 507 respectively. Switch 525 places a reference voltage or ground on capacitor 509, and switch 526 places a voltage $V_{DAC}$ on capacitor 509. The gain and differening stage 542 includes capacitor 511 to hold a charge received from linear amplifier 542; the capacitor 511 is connected to the output of linear amplifier 501 and connected to the minus input of linear amplifier 502. The plus input of linear amplifier 502 is connected to voltage $V_{REF}$. The capacitor 509 transfers charge to either actuator 505 or actuator 507. The capacitor 511 transfers the output of linear amplifier 501 to the linear amplifier 502. Thus, in actuality, since the output of linear amplifier 501 represents the voltage of actuator 505 or 507, the charge from actuator 505 or 507 is placed on capacitor 511. The gain and differening stage 542 includes capacitor 511, which receives the charge from actuator 505 during a first line period and the charge from actuator 507 during a second line period alternatively in accordance of whether actuator 505 or actuator 507 are active. Switch 527 is closed except when the charge from actuator 505 or actuator 507 is to be transferred to capacitor 513 or 511. As switch 527 is open, the charge on capacitor 511 is transferred to capacitor 513. The linear amplifier 502 will output as an voltage being the difference of the voltage sensed on actuator 505 and the voltage sensed on actuator 507. The ratio of the capacitance of capacitor 511 to capacitor 513 can add gain to the output of the linear amplifier 502. The sample and hold stage 544 includes switch 528 to allow the sample and hold stage to hold the output connected to capacitor 530 which removes noise from the input of linear amplifier 503 the other end of capacitor 530 is connected to ground. The switch 528 and the capacitor 530 are connected to the plus input of linear amplifier 503. The output of linear amplifier 503 is connected to the negative input of linear amplifier 503. Thus, a sample and hold stage 544 is achieved. The following equations indicate the voltage out of the sample and hold stage.

$$V_{OUT} + \left[\frac{C_{509}}{C_{507}} - \frac{C_{509}}{C_{505}}\right](V_{DAC} - V_{REF})\frac{C_{511}}{C_{513}} + V_{REF} \tag{1}$$

$$V_{OUT} = \frac{C_{509}}{\in A}[d_{507} - d_{505} + 2\Delta d](V_{DAC} - V_{REF})\frac{C_{511}}{C_{513}} + V_{REF} \tag{2}$$

$$V_{OUT} = \frac{C_{fixed}}{\in A}\frac{C_{511}}{C_{513}}(d_{507} - d_{505})(V_{DAC} - V_{REF}) + V_{REF} + \frac{2C_{fixed}}{\in A}\frac{C_{511}}{C_{513}}(V_{DAC} - V_{REF})\Delta d \tag{3}$$

$V_{out}$ is a measure of the displacement of actuator 505 and actuator 507

$$C_{505} = \frac{\in A_1}{d_{505} - \Delta d} \tag{4}$$

$$C_{507} = \frac{\in A_2}{d_{507} + \Delta d} \quad \Delta d = \text{Amount top membrane plate moves.} \tag{5}$$

Figure 7:
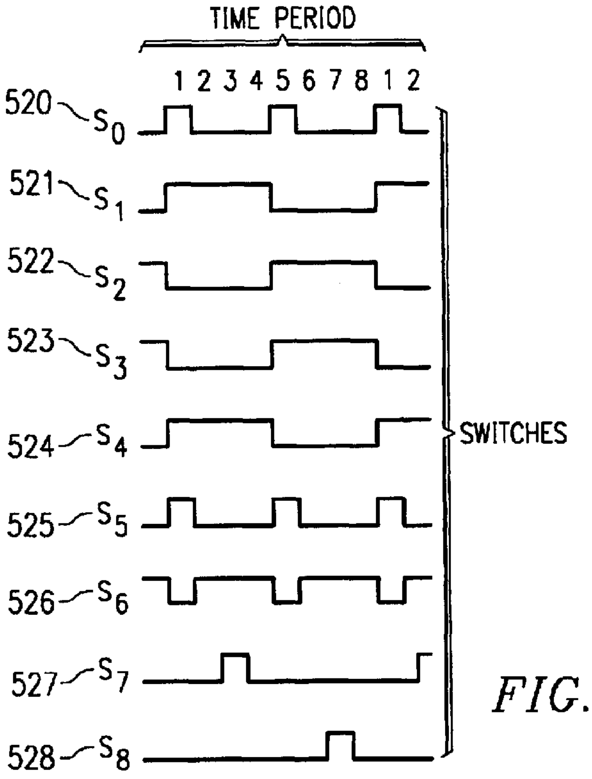
FIG. 7 illustrates a timing diagram of the present invention.

Turning now to FIG. 7, FIG. 7 illustrates the switches during different time periods or states. More particularly, eight time periods are illustrated before the sequence is repeated. The first four time periods are for actuator 505, and the second four time periods are for actuator 507. At the beginning during the first time period, switch 521, switch 525, and switch 523 are turned on or closed shorting actuator 105, actuator 107, and switch 525 is capacitor 509. During the second time period to transfer the charge to capacitor 509, the input of capacitor 509 is switched to a digital analog voltage circuit DAC by switch 526 being closed and switch 525 open to receive the voltage from the DAC to place a $V_{DAC}$ voltage on capacitor 109. Next during the third time period, the charge on capacitor 509 is transferred to actuator 505 by the operation of closing switch 521, and actuator 507 is held on reset. Switch 525 and switch 527 are open.

Capacitor 511 holds the output of linear amplifier 501 in the third time period.

In the fourth time period, switch 527 opens to allow the charge a capacitor 511 to flow to capacitor 513.

The actuators 505 and 507 switch states. Both actuators 505 and 507 are reset by opening switch 521 to transfer the charge of capacitor 511 to capacitor 513 and closing switch 522 to short actuator 505 and opening switch 523 to transfer the charge or capacitor 509 and closing switch 524 to short actuator 507 to ground. Next, switch 526 is closed during the fifth time period which shorts capacitor 509. Switch 526 opens to place the voltage $V_{DAC}$ on capacitor 507. Switch 523 closes and switch 524 opens and actuator 507 charges up with the charge of capacitor 509. There are no electrostatic differences between actuator 505 and actuator 507. The charge on actuator 107 is transferred to capacitor 511 by the closing of switch 523 at the fifth time period. As switch 527 opens, the charge is transferred to capacitor 513 and the sample and hold stage 514 outputs as voltage $V_{out}$ either the voltage from actuator 505 or the voltage from actuator 507 but holds it (I am not sure I have all the states in here correctly). Thus, consequently the capacitance is in the numerator and thus voltage $V_{out}$ is linear.

| | |
|---|---|
| State1: $\text{Voltage}C_{505} = \text{Voltage}C_{507} = 0$ | $Fes_{505} = Fes_{507} = 0$ |
| State2–4: $\text{Voltage}C_{505} = \frac{C_{509}}{C_{505}}(V_{DAC} - V_{REF})$ | $Fes_{505} = \frac{GA\left(\frac{C_{507}}{C_{505}}(V_{DAC} - V_{REF})\right)^2}{2d_{x1}^2}$ |
| $\text{Voltage}C_{507} = 0$ | $Fes_{505} = \frac{C_{509}^2(V_{DAC} - V_{REF})^2}{2 \in A}$ |
| | $Fes_{507} = 0$ |
| State5: $\text{Voltage}C_{505} = \text{Voltage}C_{507} = 0$ | $Fes_{505} = Fes_{507} = 0$ |
| State6–8: $\text{Voltage}C_{505} = 0$ | $Fes_{505} = 0$ |
| $\text{Voltage}C_{507} = \frac{C_{509}}{C_{x2}}(V_{DAC} - V_{REF})$ | $Fes_{507} = \frac{\in A\left(\frac{C_{fixed}}{C_{x2}}(V_{DAC} - V_{REF})\right)^2}{2d_{x2}^2}$ |
| | $Fes_{507} = \frac{C_{509}^2(V_{DAC} - V_{REF})^2}{2 \in A}$ |

$Fes_{505} = Fes_{507}$ The force of actuator 505 is the same as the force of actuator 507. Additionally, the voltage and hence the displacement of actuator 505 is the same as the voltage/displacement of actuator 507.

The electromechanical portion 201 could be constructed in terms of FIG. 6. An insulating layer 210 of $SiO_2$ is thermally grown on substrate 208. The control electrode trench is lithographically defined and dry etched as shown in FIG. 6*a*. A thin layer of aluminum is deposited as illustrated in FIG. 6*b*. The first metal layer is patterned and etched to define both top and recessed metallization. The electrode 214 is correspondingly formed. In FIG. 6*d*, a polymer spacer layer is deposited. The spacer layer is patterned and etched to define both top and recessed metallization in FIG. 6*e*. The metallization is deposited and etched in FIG. 6*f* to define the top metal membrane and vias, and finally the unwanted spacer under the membrane is removed with a dry etch undercut.

What is claimed is:

1. A electrostatic sensing device for sensing a voltage from a electrostatic device, comprising:

a first actuator having a first membrane and a first electrode, said first membrane being moveable;

a second actuator having a second membrane and a second electrode, said second membrane being moveable;

a control device to control said first actuator and said second actuator to alternatively charge said first actuator with a first charge and said second actuator with a second charge; and a circuit for output a first voltage linearly based on the first charge and a second voltage linearly based on the second charge, wherein said first and second actuators transfer said first and second charge to a first capacitor to generate said first voltage and said second voltage.

2. A electrostatic sensing device as in claim 1, wherein said first actuator and said second actuator are connected in parallel.

3. A electrostatic sensing device as in claim 1, wherein a linear amplifier is connected in parallel with said first and second actuator.

4. A electrostatic sensing device as in claim 1, wherein said capacitor is connected to a second linear amplifier.

5. A electrostatic sensing device as in claim 1, wherein said first and second charge is transferred to said first capacitor and then a second capacitor.

6. A electrostatic sensing device as in claim 5, wherein said second capacitor is in parallel with a second linear amplifier.

* * * * *